United States Patent [19]

Flegal

[11] Patent Number: 5,516,732
[45] Date of Patent: May 14, 1996

[54] WAFER PROCESSING MACHINE VACUUM FRONT END METHOD AND APPARATUS

[75] Inventor: Christopher Flegal, deceased, late of New City, N.Y., by Gisela H. Flegal, legal representative

[73] Assignees: Sony Corporation, Tokyo, Japan; Materials Research Corporation, Orangeburg, N.Y.

[21] Appl. No.: 985,300

[22] Filed: Dec. 4, 1992

[51] Int. Cl.$^6$ .................................................. H01L 21/00
[52] U.S. Cl. .......................... 437/250; 29/25.01; 414/935; 414/939
[58] Field of Search .......................... 437/250; 29/25.01; 414/935, 536, 937, 938, 939, 940, 941

[56] References Cited

U.S. PATENT DOCUMENTS

| | | |
|---|---|---|
| 4,674,621 | 6/1987 | Takahashi . |
| 4,722,298 | 2/1988 | Rubin et al. . |
| 4,730,976 | 3/1988 | Davis et al. . |
| 4,747,928 | 5/1988 | Takahashi et al. . |
| 4,785,962 | 11/1988 | Toshima . |
| 4,892,451 | 1/1990 | Mahler ..................................... 414/435 |
| 4,909,701 | 3/1990 | Hardegen et al. . |
| 4,917,556 | 4/1990 | Stark et al. . |
| 4,951,601 | 8/1990 | Maydan et al. . |
| 4,995,063 | 2/1991 | Enoki et al. . |
| 5,019,233 | 5/1991 | Blake et al. . |
| 5,033,927 | 7/1991 | Pelissier . |
| 5,076,205 | 12/1991 | Vowles et al. . |
| 5,092,728 | 3/1992 | Crabb et al. . |
| 5,092,729 | 3/1992 | Yamaszaki et al. . |
| 5,110,248 | 5/1992 | Asano et al. . |
| 5,125,791 | 6/1992 | Volovich . |
| 5,126,027 | 6/1992 | Kudo et al. . |
| 5,135,608 | 8/1992 | Okutani .................................... 414/941 |
| 5,135,778 | 8/1992 | Misiano et al. . |
| 5,176,493 | 1/1993 | Toro-Lira et al. ....................... 414/939 |
| 5,314,538 | 5/1994 | Maeda et al. ............................ 414/941 |
| 5,340,261 | 8/1994 | Oosawa et al. .......................... 414/939 |

*Primary Examiner*—Brian E. Hearn
*Assistant Examiner*—Kevin M. Picardat
*Attorney, Agent, or Firm*—Wood, Herron & Evans

[57] ABSTRACT

A carrousel type wafer processing machine in which wafers are held in vertical orientations in holders on a rotatable plate and sequenced through a plurality of processing stations for processing, such as by the application of a sputtered film thereto, is provided with a vacuum front end module that transfers wafers between cassette modules in which the wafers are horizontally disposed and a loading and unloading station of the processing machine, through a transfer chamber. The transfer chamber includes a wafer transfer arm, an aligning station, a preheating and degassing station, a cooling station preferably combined with the preheating station, and an uprighting station from which wafers are exchanged with the processing machine. The arm moves unprocessed wafers individually from a cassette module to the aligner, then to the preheating station, then to the uprighting station. The arm also moves processed wafers from the uprighting station, to the cooling station and to a cassette module. Preferably, one cassette module is being vented, reloaded or replaced, and pumped to a vacuum while the wafers of the other are being cycled through the processing machine.

13 Claims, 2 Drawing Sheets

WAFER PROCESSING MACHINE VACUUM FRONT END METHOD AND APPARATUS

The present invention relates to the processing of wafers such as semiconductor wafers, and, more particularly, to pre and post processing handling and treatment of wafers in a vacuum between wafer cassette modules and a multistation wafer processing machine.

BACKGROUND OF THE INVENTION

In the processing of semiconductor wafers, processes such as sputter coating processes for the deposition of films, such as films of aluminum, are employed. Such processes are often carried out in machines such as, for example, that disclosed in U.S. Pat. No. 4,909,695, assigned to the assignee of the present application, and expressly incorporated by reference herein. In such machines, wafers are individually introduced from an external atmosphere, through a loadlock onto one of a plurality of wafer holders in a vertically disposed circular plate, and then moved, by rotating the plate about a horizontal axis, to index it sequentially through a plurality of processing stations in which a series of process steps are performed carried out. Such steps may include, for example, sputter etching and sputter coating steps such as those that result in application of an aluminum coating to the wafers. Typically, throughput for such a machine is slightly more than one minute per wafer for deposition of a one micron film of aluminum.

In introducing the wafers from the external atmosphere, inevitably some particulate or other contamination is introduced into the internal environment of the processing machine. Ideally, introduction of such contaminants should be totally prevented or at least kept at a minimum, as each particle or contaminant can result in a defective device on the wafer and thus reduce the ultimate value of the wafer.

Further, in such a processing machine, the performance of an initial preheating or degassing step is desirable. Such a step may be performed in the loadlock of the machine, and provision therefore has been made by a backplane heater in the apparatus disclosed in the patent incorporated above. In the loadlock chamber after being introduced from the external atmosphere, such degassing to drive off water vapor from the wafer is of limited effectiveness. Unremoved gases are a potential process contaminant that can also adversely affect the quality of a deposited film.

The processing of a wafer to produce completed semiconductor devices involves more processes than are performed in machines of the type referred to above. Some processes are performed before, and others after, introduction of the wafers into such a machine. The transporting of wafers between machines often results in contamination or deterioration of the wafers by exposure to atmosphere. With wafers coated with titanium-tungsten (TiW) films, for example, their exposure to ambient atmosphere before or after a subsequent coating cycle allows oxygen to contact and affect the TiW film, causing metallurgical change, introducing stress in the TiW film, or causing the film to fracture and flake.

In the processing of wafers described above, there is a need to increase the throughput of the wafer processing equipment, particularly equipment of the vertical carrousel type described in the patent incorporated above, and to reduce and remove contaminants from the process performed in the apparatus.

In the commonly assigned and copending U.S. patent application Ser. No. 07/701,800, entitled WAFER PROCESSING CLUSTER TOOL BATCH PREHEATING AND DEGASSING METHOD AND APPARATUS, expressly incorporated herein by reference, further needs for pre and post processing handling and treating of wafers, and for the interfacing of processing equipment with standard wafer cassette modules are set forth. In such cassette modules, wafers are horizontally oriented in a vertical stack in a plastic rack, and the modules are each sealed to a port of a transfer module and pumped to a vacuum before opening the port. The pumping of one such module typically takes more than ten minutes. Such modules may also be sealed with wafers enclosed therein and moved from machine to machine.

There is a particular need to efficiently and effectively interface wafer processing equipment, particularly of the vertical carrousel type, with such cassette modules in a way that will optimize the use of the coating machine.

SUMMARY OF THE INVENTION

A primary objective of the present invention is to provide a wafer processing machine, particularly a serial or sequential vertical wafer processing machine, for example of the carrousel type, with vacuum front end unit or module that is capable of for rapidly transferring wafers to and from a single access port of the vertical processing machine from and to multiple wafer sealable cassette modules, particularly those in which in which the wafers are horizontally disposed, while maintaining isolation of the wafers from external atmosphere and thereby minimizing contamination.

It is a further objective of the present invention to provide a wafer pretreatment and post treatment capability, particularly for the preheating or degassing of wafers prior to processing in the apparatus and for the post processing cooling of the wafers to expedite their return to a cassette module.

According to the principles of the present invention, a vertical sequential wafer processing machine is provided with a vacuum front end module having ports connecting to an inlet port of the apparatus and to a cassette loadlock port at which wafers are horizontally disposed. The module is preferably provided with a pair of inlet/outlet ports for connecting to a pair of standard wafer cassette modules that are sealable and evocable so as to serve as loadlocks for the front end module, which can be maintained at a vacuum pressure level and of the same atmosphere of the processing apparatus.

In the preferred embodiment of the invention, the vacuum front end module functions as a transport module and contains therein a robot transfer assembly having an arm that is rotatable about a fixed axis and is extendable radially from the axis. Disposed within the transport module around this axis are a plurality of stations, including a wafer aligning station, a combined preheating/degassing and cooling station, and an uprighting station. Each of these stations includes a wafer receiving position in approximate horizontal alignment with a plane of the transfer arm so that the arm can deliver wafers to and receive them from each station by rotation of the arm about the axis and extending and retracting the arm and raising the arm above and lowering the arm below the plane. Each of the cassettes is also positioned so as to be similarly accessible by the transfer arm. The transfer arm is preferably of a frogleg type, having a pair of hinged two section extendable members linked together, such as disclosed in U.S. Pat. Nos. 4,666,366, 4,730,976 and 4,909,701.

The arm has two vertical positions including a raised and a lowered position. At the lowered position, the arm moves into and out of slots of the cassette modules to load and unload wafers therefrom. Racks in the cassette modules move vertically to present each of the wafer holding slots thereof selectively in line with this lowered arm position. At the raised position of the arm, the arm moves to and from the other stations of the module to position wafers just above the wafer receiving positions of the stations that are in approximate horizontal alignment with the lowered position of the arm, so that the arm can load and unload wafers to and from the station's receiving positions by respective downward and upward movement between the two vertical positions of the arm.

The aligning station preferably includes a non-contacting sensor, such as an LED and CCD array combination spaced respectively above and below the wafer receiving position at which a wafer is placed by the arm onto a rotatable support made of, for example, set of pins or a support table. The table rotates and the sensor detects the position of the edge of a wafer supported thereon with respect to an axis of rotation thereof and as a function of angular position. Detected wafer edge position data is processed by a microprocessor to determine the effective center of the wafer and the location of a fiducial mark such as a reference notch or flat on the wafer edge. Information thereby generated by the microprocessor is used to control the transfer arm to perform what is referred to as a "delta pick-up", which compensates for any rotational or eccentricity misalignment, so that the wafer, when returned to the arm, is in a precisely known centered and oriented location with respect to the arm.

The preheating and cooling station preferably includes a support moveable between a heating position above the wafer receiving position and a cooling position below the wafer receiving position. At the heating position, the wafer is heated by a set of radiant lamps positioned at the top of the station and at the cooling position the wafer is cooled by, for example, vacuum clamping the wafer to a cooled surface at the bottom of the station.

The uprighting station preferably includes a wafer support platen at the receiving position of the uprighting station. The platen is carried on one end of a wafer uprighting arm that is pivotally supported at other end about a horizontal pivot axis. The pivot axis is generally parallel to the vertical plane of a holder of the processing apparatus. The arm is generally centered on a vertical plane perpendicular to and through the center of the holder at an inlet/outlet port of the processing apparatus, so that, by 90° rotation of the arm, the platen is moved from a horizontal wafer supporting orientation at the receiving position at the uprighting station to a vertical orientation at the holder in the inlet/outlet port of the processing apparatus. The platen includes clamping means, such as clips or a vacuum chuck, for holding a wafer to the platen so that it can be moved between the holder of the apparatus and the receiving position of the uprighting station.

In operation, the apparatus equipped with the vacuum front end according to the principals of the present invention provides advantages of efficiency and reduced contamination of the wafers being processed. Wafers are presented to one of the inlet/outlet ports of the module in a first sealed cassette, isolated from the surrounding atmosphere. While wafers in a second cassette module are being processed, the first cassette is evacuated, whereby the processing time of the equipment is not interrupted during such pumpdown. Wafers may be loaded and unloaded to and from the cassette through a load lock door therein, or the entire cassette modules may be sealed and exchanged, with the wafers sealed therein, so the wafers can be transported between machines without exposure to ambient atmosphere.

Once the first cassette is evacuated, a gate between the cassette and module is opened and the elevator within the cassette sequentially presents the wafers individually to a transfer position vertically aligned in the horizontal plane of the lowered position of the transfer arm. The arm extends and removes the wafer at the transfer position by retracting from the cassette and then raises, rotates and lowers to place the wafer at the receiving position at the aligning station. When the alignment data is collected by the sensor of the aligner, the arm picks up the wafer from the aligner, properly aligned by arm movements responsive to the alignment data, and similarly places the aligned wafer at the receiving position of the preheating and cooling station on a support. The support then lifts the wafer and the lamps are energized, thereby degassing the wafer. From the preheating station, the wafer is then similarly moved by the transfer arm to the platen of the uprighting station, to which it is clamped and then tilted to a vertical orientation at which it is placed in the holder at the of in the inlet/outlet port of the processing apparatus.

This wafer is then carried to the first processing station of the processing apparatus by rotation of an index plate therein that carries the holder. This rotation brings a processed wafer from the last station within the processing apparatus into the inlet/outlet port.

From the inlet/outlet port of the processing apparatus, a processed wafer is picked up by the platen in its vertical orientation and lowered and rotated to a horizontal orientation at the receiving position of the uprighting station, where it is picked up by the transfer arm and transferred to the preheating and cooling station. At the preheating and cooling station, the processed wafer is lowered to the cooling position at which it is vacuum clamped onto a cooled support and rapidly cooled to a temperature at which it can be placed into a standard plastic wafer supporting rack in a cassette module, for example the first cassette, to which it is then directly transferred by the transfer arm.

During the processing of wafers from, and reloading wafers to, the first cassette, the second cassette is exchanged to bring a fresh set of unprocessed wafers to the apparatus, and the second cassette is pumped to the vacuum level of the module. The gate to the first cassette is then closed and the gate to the second cassette is opened. Also, the movements of wafers incident to the exchange of processed and unprocessed wafers at the input/output port of the machine, and the pre and post processing treatment thereof, takes place during a machine process cycle without delay of the machine or other loss of processing time.

The combination and procedure outlined above provides for fast efficient and continuous throughput of wafers to the carrousel type wafer processing apparatus, while retaining the wafers in an clean atmosphere isolated from ambient atmosphere. It also provides for effective and efficient preheating and post processing cooling of the wafers, alignment of the wafers to prevent damage thereof, and change of attitude, between horizontal and vertical, to interface with corresponding equipment.

These and other objectives and advantages of the present invention will be apparent from the following detailed description of the drawings in which:

DETAILED DESCRIPTION OF THE DRAWINGS

Figure 1:
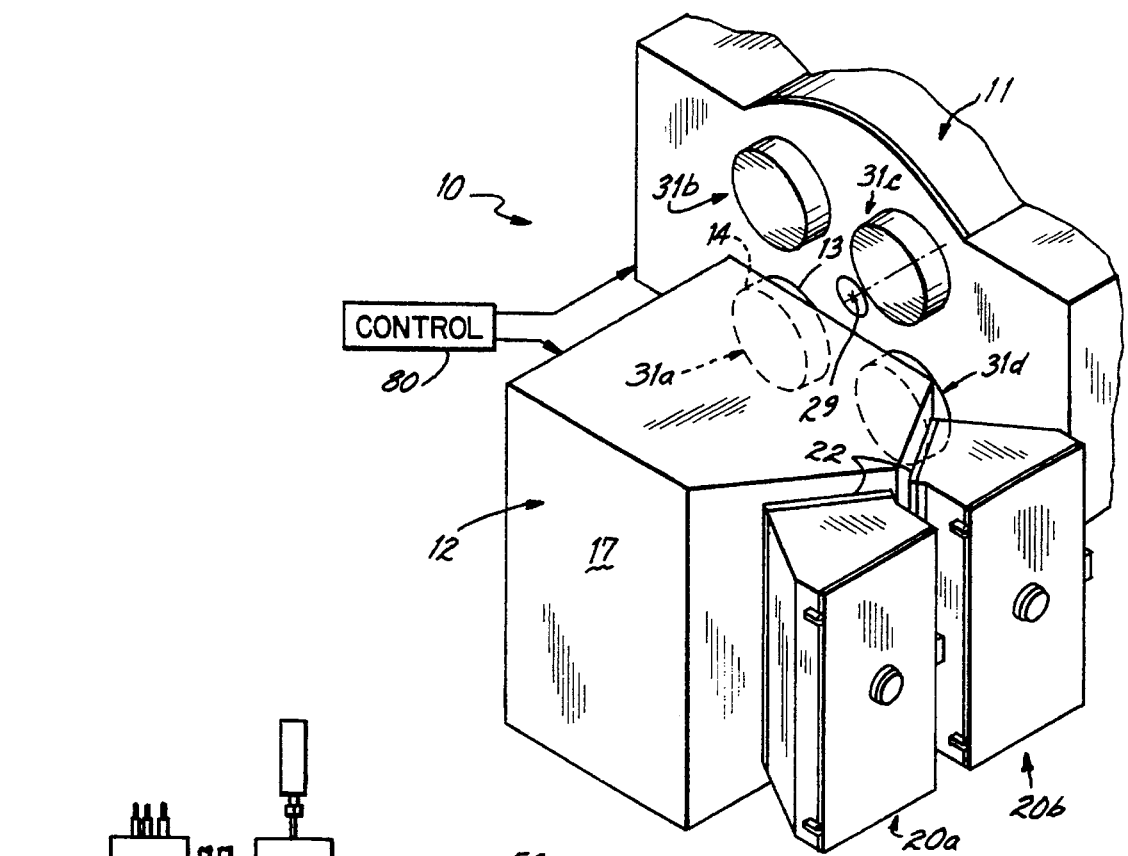
FIG. 1 is an isometric diagram of a vertical processing sequential carrousel type wafer processing apparatus equipped with a vacuum front end module according to principals of the present invention.
Figure 2:
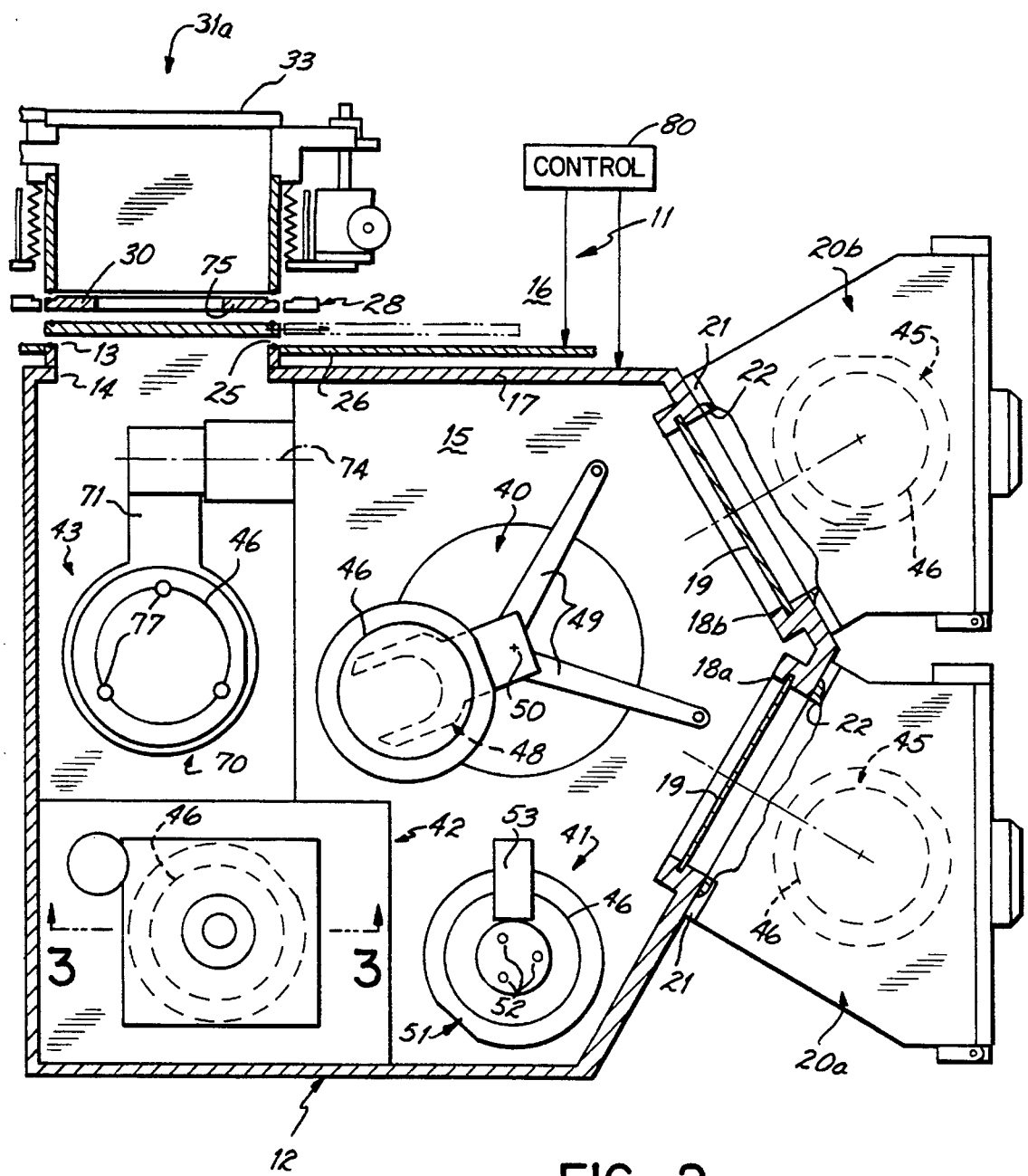
FIG. 2 is a top plan view taken along the line 2—2 of FIG. 1 illustrating the apparatus of FIG. 1.

Referring to FIGS. 1 and 2, a wafer processing apparatus 10 is illustrated that includes a carrousel type wafer processing machine 11 equipped with a vacuum front end module 12. The machine 11 is, for example, of the type described in U.S. Pat. No. 4,909,695, referred to above, and incorporated by reference herein. The machine disclosed in this patent is modified to eliminate the wafer handling front end disclosed in the patent in FIGS. 4 through 15B thereof, which is replaced with the module 12 described herein. The loadlock door of the machine disclosed in this patent has also been removed to form an inlet/outlet port 13, which connects to a corresponding machine interface port 14 of the module 12, and permanently communicating the vacuum atmosphere of the interior 15 of the module 12 with that of that of the main chamber 16 of the processing apparatus 11. This permanent connection is practical with the machine of the patent in that each of the processing stations therein is separately isolatable from the main chamber 16. Without such separate isolation feature, other means would be preferred to prevent the processes within the apparatus from propagating contaminants into the module 12.

The module 12 is equipped with a closed housing 17 which is provided with two cassette loading and unloading ports 18, illustrated as 18a and 18b, to which are connected two cassette carriers 20, illustrated as 20a and 20b, respectively. The cassette carriers 20 are conventional cassette modules having a gate 21 that allows for the sealing of the port 22 thereto when cassette modules 20 are exchanged. The transport module 12 is also provided with a gate valve 19 to seal each of the ports 18 therein when the cassette modules 20 are changed. The port 22 of the modules 20 sealably connects to a respective one of the ports 18 of the module 12 so that the gate valves 19 and 21 can be opened to pass wafers therethrough while under vacuum. This is better illustrated in FIG. 2.

Referring to FIG. 2, interior 15 of the front end module 12 is illustrated surrounded by the housing 17. The machine interface port 14 is an opening in the housing 17, which opening is surrounded by a seal 25 that seals the housing 17 to a machine housing 26 that encloses the main chamber 16 of the machine 11, thereby aligning the opening with the inlet/outlet port 14 of the machine 11.

In the main chamber 16 of the machine 11 is an index plate 28, rotatable about a horizontal axis 29, containing a plurality wafer holders 30, for example four in number, spaced at equal circumferencial intervals about the axis 29 to align with a corresponding plurality of stations 31, illustrated as 31a–31d, in FIG. 1. The stations 31b–31d are processing stations, such as sputter coating and sputter etching stations, and the station 31a is a loading and unloading station to which access is provided by the port 14. Because the module 12 is connected to the inlet/outlet port 14 of the machine 11, an access door 33 is provided for the servicing of the holder 30.

As illustrated in FIG. 2, the module 12 includes the two cassette modules or loadlocks 20a, 20b, a frogleg robot arm 40, a wafer aligner 41, a preheating and cooling station 42 and an uprighting mechanism 43.

Each of the loadlocks or cassette modules 20 includes a standard wafer elevator rack 45 in which are typically carried a set of twenty-five horizontally disposed and vertically spaced wafers 46. The racks 45 move vertically in the loadlocks 20 to bring each of the wafers selectively into alignment with a horizontal transfer plane of the module 12.

The transfer arm 40 includes a wafer gripper 48 at the end of extendable hinged members 49. The arm 40 is rotatable about a vertical transfer axis 50 and is moveable axially in a vertical direction between a lowered position in the horizontal transfer plane of the module 12 and a raised position slightly thereabove. The grippers 48 are moveable radially toward and away from the axis 50 by operation of the extendable members 49 of the arm 40.

The wafer aligner 41 a rotatable wafer support 51 formed of the upper ends of three pins 52, which lie in the horizontal transfer plane of the module 12 and onto which a wafer is placed by the gripper 48 of the arm 40. The aligner 41 includes a LED source 53, positioned above the transfer plane, and a CCD receiver (not shown) spaced directly below the LED 53 below the transfer plane. On the table 51 a wafer is rotated and the position of its edge is sensed to generate data to be interpreted by a microprocessor to control movements of the arm 40 that compensate for rotational and off-center misalignment of the wafer.

Figure 3:
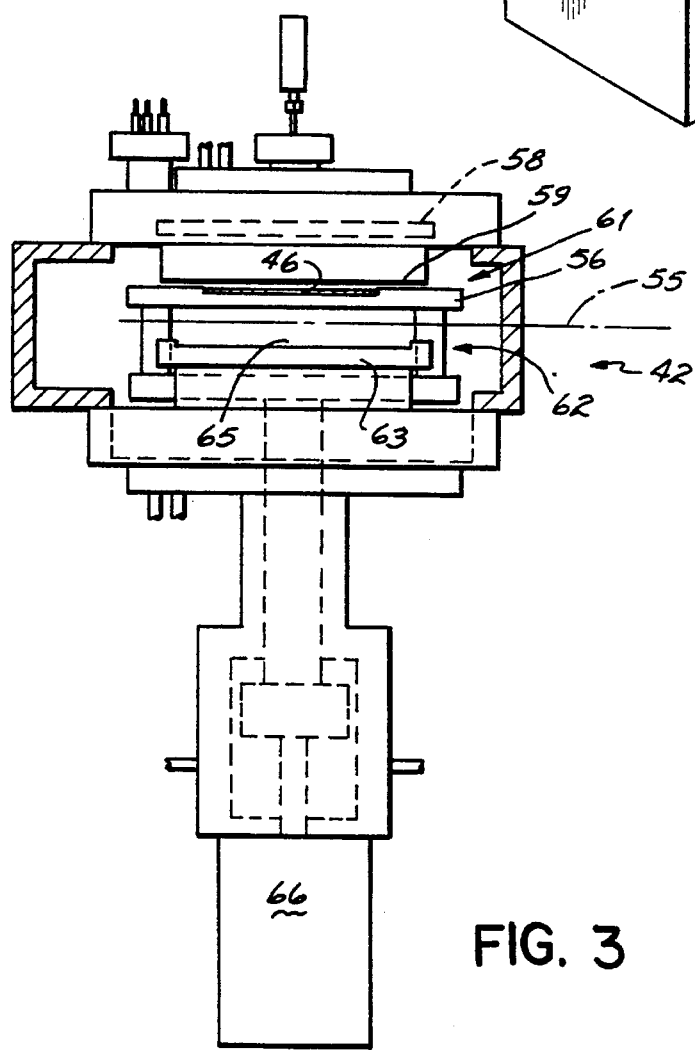
FIG. 3 is a side cross sectional diagram of the preheating/ cooling station of the apparatus of FIG. 1 taken along the line 3—3 of FIG. 2.

The preheating and cooling station 42 is best illustrated in FIG. 3 which shows the components thereof positioned relative to the horizontal transfer plane 55. A vertically moveable wafer support table in the form a ring shaped poppet 56 is shown in an upper position. From this position, the poppet 56 is lowered into alignment with the plane 55 to receive a wafer from the transfer arm gripper 48, which will move into the station 42 by extension of the frogleg members 49 while the transfer arm 40 is in the raised position above the plane 55. When the gripper 48 is above the poppet 56, the arm 40 lowers the wafer 46 thereon.

When the wafer 46 is on its way to the processing machine 11, the preheating and cooling station 42 is used to heat and degas the wafer. After processing, the wafer is cooled in the station 42. To provide the preheating function, a degassing section is provided at the top of the station 42, which includes a bank of infrared radiant heat lamps 58 positioned above a quartz window 59 at the top of the station 42. For heating of wafers 46, the poppet 56 is moved upward from the plane 55 to that illustrated in FIG. 3 to support the wafer at a degassing position 61 near the window 59.

To provide the cooling function, a cooling section 62 is provided at the bottom of the station 42, which includes platen 63. The platen 63 is cooled by cooling liquid that flows through ports therein (not shown). The platen 63 is provided with vacuum hold down means for clamping a wafer thereto for cooling in a position 65 against the upper surface thereof. The wafer on the ring shaped poppet 56 is placed at the cooling position 65 by downward movement to a position where it surrounds the platen 63. The poppet 56 is raised and lowered by a pneumatic cylinder 66 in the base of the station 42.

The uprighting station 43 is provided with a wafer supporting platen 70 mounted to the free end of an uprighting lever 71 that is pivotally supported to swing in a 90° arc about a horizontal axis 74 that is parallel to a vertical plane 75 that contains the index plate 28 of the processing machine 11. The lever 71 swings from a horizontal position at which the platen 70 has a wafer supporting surface facing upwardly at a wafer receiving position in the transfer plane 55 to a vertical position at which the surface of the platen 70 and a wafer thereon is transferred to or received from the holder 30 at the port 14 of the machine 11. In the horizontal receiving position, the platen 70 receives a wafer from or presents a wafer to the gripper 48 of the transfer arm 40. The platen 70 is provided with clamp structure such as a set of three lock rollers 77 to grip the wafer on the platen at its edge and hold it thereto for uprighting to the port 14 or lowering to the plane 55.

The operation of the machine 11 and of the module 12 are controlled and coordinated with by software in a programmable controller 80 connected to the operating elements of the apparatus 10.

Only one embodiment of the invention has been herein described, but those skilled in the art will appreciate that various additions, alternatives or modifications to that described may be employed without departing from the principles of the present invention. Accordingly,

What is claimed is:

1. A wafer processing apparatus comprising:
   a wafer processing machine having a main vacuum chamber therein, a plurality of workstations disposed at equally spaced angular intervals in a vertical plane around a horizontal axis in the main chamber, the plurality of workstations including a plurality of processing stations and a loading and unloading station, an index plate rotatably mounted in the main chamber and having a plurality of wafer holders mounted thereon at angular intervals about the horizontal axis such that the plate rotates to carry the holders sequentially through the workstations and to simultaneously position each of the holders at different ones of the workstations;
   a transfer module having a vacuum transfer chamber therein, a plurality of treatment stations disposed in the transfer chamber, and a loading and unloading port communicating between the transfer chamber and the loading and unloading station of the wafer processing machine;
   two wafer cassette loadlock chambers each containing means for supporting a plurality of horizontally disposed wafers in a vertical stack therein, and having an interior selectively connectable through a sealable port to the transfer chamber of the transfer module;
   the treatment stations including:
      a wafer aligning station having means thereat for establishing rotational and eccentrical alignment of a wafer positioned thereat,
      a wafer preheating station having wafer heating means thereat,
      a wafer cooling station having wafer cooling means thereat, and
      a wafer uprighting station including means thereat for rotating a wafer thereat and carrying the wafer through the loading and unloading port between a horizontal orientation in the transfer chamber to a vertical orientation in a holder in the loading and unloading station of the wafer processing machine; and
   a transfer arm in the transfer chamber operable to pickup a wafer from, and deposit the wafer at, a receiving position at each of the treatment stations and in each of the loadlock chambers and to transfer wafers among each of the receiving positions.

2. A transfer module for a wafer processing apparatus having a vacuum chamber therein, a loading and unloading station in the vacuum chamber having a holder located therein for holding a wafer in a vertical orientation, comprising:
   a vacuum transfer chamber;
   a radially extendable wafer transfer arm pivotal about a vertical axis within the transfer chamber;
   a plurality of treatment stations disposed approximately in a horizontal plane about the vertical axis in the transfer chamber;
   a loading and unloading port communicating between the transfer chamber and the loading and unloading station of the wafer processing machine;
   two wafer cassette loadlock chambers each containing a rack for supporting a plurality of horizontally disposed wafers in a vertical stack therein, and having an interior selectively connectable through a sealable port to the transfer chamber;
   the treatment stations including a wafer aligning station having means thereat for generating signals containing information of rotational and eccentrical alignment of a wafer positioned thereat without physically contacting the wafer;
   the treatment stations also including a two section temperature treatment station, including a preheating section having wafer heating means thereat, a cooling section having wafer cooling means thereat, and a moveable wafer support for moving a wafer between a receiving position and each of the sections;
   a wafer uprighting station including a platen thereat having means for holding a wafer thereto, the platen being pivotally mounted in the transfer module to swing, and carry a wafer, through the loading and unloading port between a horizontal orientation in the horizontal plane in the transfer chamber to a vertical orientation in the holder in the loading and unloading station of the machine; and
   the transfer arm including an extendable member pivotally connected at an end thereof at the vertical axis and having a wafer engager at a free end thereof, the arm being operable to engage a wafer with the engager and pickup the wafer from, and deposit the wafer at, a receiving position at each of the treatment stations and in each of the racks of the loadlock chambers, and to transfer wafers among each of the receiving positions.

3. A method of handling and processing wafers comprising the steps of:
   providing a plurality of horizontally oriented wafers spaced in a vertical stack in at least one cassette module, including a first cassette module, in a vacuum environment in communication with a transfer chamber;
   moving a horizontally oriented wafer from the first cassette module to an aligning station in the transfer chamber and aligning the wafer thereat;
   moving the aligned wafer from the aligning station to a preheating station in the transfer module and heating the wafer to degas the wafer;
   moving the degassed wafer from the preheating station to an uprighting station in the transfer module;
   moving the wafer from a horizontal orientation at the uprighting station through a loading port to a vertical orientation in a loading station in a wafer processing machine;
   processing the wafer while in the vertical orientation in the wafer processing machine;

moving the processed wafer from the vertical orientation in the loading station of the wafer processing machine through the loading port and to a horizontal orientation at the uprighting station;

moving the wafer from the uprighting station to a cooling station in the transfer module and cooling the wafer thereat; and moving the wafer from the cooling station to a storage position in the cassette module.

4. The method of claim 3 wherein:

the preheating station and cooling station are located in the transfer chamber;

the steps of moving the wafer to the preheating station and the cooling station include the step of moving the wafer to a receiving position at the preheating and cooling station and then moving the wafer from the receiving position to the respective heating or cooling station.

5. The method of claim 3 wherein:

the at least one cassette module further includes a second cassette module; and the method further comprises the step of replacing a plurality of processed wafers in the second cassette module with a plurality of unprocessed wafers while wafers from the first cassette module are being processed.

6. A method of handling and processing wafers comprising the steps of:

providing a plurality of wafers each in a horizontal orientation and vertically spaced from each other in a stack in a cassette module in a vacuum environment in selective communication with a transfer chamber;

moving a wafer from the cassette module in the horizontal orientation to an aligning station in the transfer chamber and sensing the eccentric and rotational alignment of the wafer thereat;

moving the wafer in the horizontal orientation from the aligning station in angular and axial alignment at a preheating station in the transfer module and heating the wafer at the preheating station to degas the wafer;

moving the degassed wafer in the horizontal orientation from the preheating station to an uprighting station in the transfer module;

moving the wafer from the horizontal orientation at the uprighting station through a loading port to a vertical orientation in a loading station of a wafer processing machine;

processing the wafer while in the vertical orientation in the wafer processing machine;

moving the processed wafer from the vertical orientation in the loading station of the wafer processing machine through the loading port and to the horizontal orientation at the uprighting station;

moving the wafer from the uprighting station in the horizontal orientation to a cooling station in the transfer module and cooling the wafer thereat; and moving the wafer in the horizontal orientation from the cooling station to a horizontally oriented storage position in a cassette module.

7. The method of claim 6 wherein:

the preheating station and cooling station are located in the transfer chamber and;

the steps of moving the wafer to the preheating station and the cooling station each include the step of moving the wafer to a receiving position at the preheating and cooling station and then moving the wafer from the receiving position to the respective heating or cooling station.

8. The method of claim 6 wherein:

the at least one cassette module further includes a second cassette module; and the method further comprises the step of replacing a plurality of processed wafers in the second cassette module with a plurality of unprocessed wafers while wafers from the first cassette module are being processed.

9. A wafer processing apparatus comprising:

a wafer processing machine having a main vacuum chamber therein, a plurality of workstations spaced at equal angular intervals in a vertical plane in a circle around a horizontal axis in the main chamber, the plurality of workstations including a plurality of processing stations and a loading and unloading station, a rotatable index plate in the main chamber and having a plurality of wafer holders thereon spaced at the equal angular intervals in a circle about the horizontal axis such that, as the plate is indexed, the holders are sequentially moved through the workstations and simultaneously positioned at different ones of the workstations;

a transfer module having a vacuum transfer chamber therein, a plurality of treatment stations horizontally disposed in the transfer chamber, and a loading and unloading port communicating between the transfer chamber and the loading and unloading station of the wafer processing machine;

a plurality of wafer cassette loadlocks each having a rack support therein configured to hold a plurality of wafers in a horizontal orientation vertically spaced in a stack therein, the loadlocks having an interior selectively connectable through a sealable opening to the transfer chamber of the transfer module;

the treatment stations including:

a wafer aligning station;

a wafer preheating station having a wafer heater thereat, a wafer cooling station having a wafer cooler thereat, and a wafer uprighting station having an uprighting mechanism thereat configured to move a wafer carried thereby between a horizontal orientation in the transfer chamber to a vertical orientation in the loading and unloading station of the wafer processing machine; and a transfer arm in the transfer chamber operable to pickup a wafer from, to deposit the wafer at, and to transfer wafers among selected treatment stations and loadlocks.

10. A transfer module for a wafer processing apparatus having a vacuum chamber therein, a loading and unloading station in the vacuum chamber having a holder located therein for holding a wafer in a vertical orientation, the transfer module comprising:

a vacuum transfer chamber;

a radially extendable wafer transfer arm pivotal about a vertical axis within the transfer chamber;

a plurality of treatment stations disposed approximately in a horizontal plane about the vertical axis in the transfer chamber;

a loading and unloading port communicating between the transfer chamber and the loading and unloading station of the wafer processing machine;

two wafer cassette loadlocks each containing a rack for supporting a plurality of horizontally disposed wafers in a vertical stack therein, and having an interior selectively connectable through a sealable gate to the transfer chamber;

the treatment stations including a wafer aligning station having thereat sensors for determining rotational and eccentric alignment of a wafer positioned thereat without physically contacting the wafer;

the treatment stations also including at least one temperature treatment station, including a preheating section having a wafer heater thereat and a cooling section having a wafer cooler thereat;

a wafer uprighting station having a wafer holder thereat that is pivotally mounted in the transfer module and moveable to carry a wafer, through the loading and unloading port, between a horizontal orientation in the horizontal plane in the transfer chamber to a vertical orientation in the holder in the loading and unloading station of the machine; and the transfer arm including an extendable member pivotally connected at an end thereof at the vertical axis and having a wafer engager at a free end thereof, the arm being operable to engage a wafer with the engager and pickup the wafer from, and deposit the wafer at, a receiving position at each of the treatment stations and in each of the racks of the loadlocks, and to transfer wafers among each of the receiving positions.

11. A wafer processing apparatus comprising:

a plurality of cassette modules having a loadlock chamber therein adapted to support a vertical stack of horizontally oriented wafers and each having a gate;

a vertical carrousel type wafer processing machine having a vacuum chamber therein and a wafer loading and unloading port communicating with the vacuum chamber; and a vacuum front end module interconnecting the cassette modules at the gates thereof and the processing machine at the port thereof, a transfer chamber therein selectively communicable with the vacuum chamber and the loadlock chambers, a moveable transfer arm therein moveable to transfer wafers in a horizontal orientation about the transfer chamber and edgewise through the gates of the cassette module, an uprighting mechanism in the transfer chamber operable to transfer wafers axially through the port and between the horizontal orientation in the transfer chamber and a vertical orientation in the processing chamber.

12. The apparatus of claim 11 wherein:

the transfer chamber contains a rotatable and extendable transfer arm mounted therein and operable to move individual wafers operable to move individual wafers horizontally to and from the loadlocks from and to the uprighting mechanism.

13. The apparatus of claim 11 wherein:

the transfer chamber has a plurality of treatment stations located therein and the transfer is operable for transferring wafers individually to and from a selected one of the treatment stations.

* * * * *

UNITED STATES PATENT AND TRADEMARK OFFICE
CERTIFICATE OF CORRECTION

PATENT NO. : 5,516,732
DATED : May 14, 1996
INVENTOR(S) : Christopher Flegal, Deceased It is certified that error appears in the above-indentified patent and that said Letters Patent is hereby corrected as shown below:

Column 12, line 23, delete "operable to move individual wafers".

Signed and Sealed this

Seventeenth Day of December, 1996

Attest:

BRUCE LEHMAN

Attesting Officer        Commissioner of Patents and Trademarks